United States Patent
Rivero et al.

(10) Patent No.: US 9,812,399 B2
(45) Date of Patent: Nov. 7, 2017

(54) PREVENTION OF PREMATURE BREAKDOWN OF INTERLINE POROUS DIELECTRICS IN AN INTEGRATED CIRCUIT

(71) Applicant: STMicroelectronics (Rousset) SAS, Rousset (FR)

(72) Inventors: Christian Rivero, Rousset (FR); Pascal Fornara, Pourrieres (FR); Jean-Philippe Escales, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 15/137,063

(22) Filed: Apr. 25, 2016

(65) Prior Publication Data

US 2017/0098615 A1    Apr. 6, 2017

(30) Foreign Application Priority Data

Oct. 1, 2015 (FR) ...................................... 15 59337

(51) Int. Cl.

| H01L 23/48 | (2006.01) |
|---|---|
| H01L 23/532 | (2006.01) |
| H01L 21/768 | (2006.01) |
| H01L 21/02 | (2006.01) |
| H01L 23/528 | (2006.01) |
| H01L 23/522 | (2006.01) |

(52) U.S. Cl.
CPC .. *H01L 23/53295* (2013.01); *H01L 21/02167* (2013.01); *H01L 21/76829* (2013.01); *H01L 21/76877* (2013.01); *H01L 23/528* (2013.01); *H01L 23/5226* (2013.01); *H01L 23/53228* (2013.01); *H01L 21/0217* (2013.01)

(58) Field of Classification Search
CPC ......... H01L 23/53295; H01L 23/53228; H01L 23/53238; H01L 21/76829; H01L 21/02167; H01L 21/76877; H01L 21/0217; H01L 21/76843; H01L 21/76879; H01L 21/76883
See application file for complete search history.

(56) References Cited

U.S. PATENT DOCUMENTS

| 2003/0001282 | A1 | 1/2003 | Meynen et al. |
|---|---|---|---|
| 2005/0151266 | A1 | 7/2005 | Yoshizawa et al. |
| 2005/0184397 | A1 | 8/2005 | Gates et al. |
| 2006/0108687 | A1* | 5/2006 | Boyanov ........... H01L 21/02145 257/751 |
| 2006/0189133 | A1* | 8/2006 | Dimitrakopoulos ......................... H01L 21/76825 438/687 |

(Continued)

OTHER PUBLICATIONS

INPI Search Report and Written Opinion for FR 1559337 dated Jul. 8, 2016 (8 pages).

*Primary Examiner* — (Vikki) Hoa B Trinh
(74) *Attorney, Agent, or Firm* — Gardere Wynne Sewell LLP

(57) ABSTRACT

A non-porous dielectric barrier is provided between a porous portion of a dielectric region and an electrically conductive element of an interconnect portion of an integrated circuit. This non-porous dielectric barrier protects the integrated circuit from breakdown of the least one dielectric region caused by electrical conduction assisted by the presence of defects located in the at least one dielectric region.

14 Claims, 5 Drawing Sheets

(56) References Cited

U.S. PATENT DOCUMENTS

2007/0013069 A1  1/2007  Tada et al.
2007/0077782 A1  4/2007  Lee et al.
2012/0168915 A1  7/2012  Du et al.

\* cited by examiner

PREVENTION OF PREMATURE BREAKDOWN OF INTERLINE POROUS DIELECTRICS IN AN INTEGRATED CIRCUIT

PRIORITY CLAIM

This application claims priority from French Application for Patent No. 1559337 filed Oct. 1, 2015, the disclosure of which is incorporated by reference.

TECHNICAL FIELD

Methods of implementation and embodiments of the invention relate to integrated circuits, especially to CMOS technology processes, and more particularly to the prevention of premature breakdown of interline porous dielectrics in the interconnect portion (commonly referred to as the "back end of line" or BEOL portion) of an integrated circuit.

BACKGROUND

The interconnect portion of an integrated circuit conventionally includes at least one metallization level, and, in general, a plurality of metallization levels, each including electrically conductive lines, for example metal lines such as lines made of copper, allowing the various components of the integrated circuit to be interconnected and/or connected to inputs/outputs of the integrated circuit.

To complete interconnection, the interconnect portion also generally includes one or more via levels located between the metallization levels and allowing certain of the metal lines to be connected together.

In certain cases, an interline dielectric region separating two metal lines may break down prematurely, in particular when these two lines are separated by a very small distance, for example equal to the minimum distance specified for the CMOS technology node used.

The more advanced the CMOS technology node, i.e. the smaller the minimum distance, the more critical this effect becomes.

SUMMARY

The inventors have observed that this premature breakdown effect is in particular observed when the presence of a potential difference applied between two metal lines is combined with the presence of moisture and/or ionic contamination in the dielectric, especially when the dielectric is porous.

The inventors have therefore deduced that this premature breakdown effect is due to a conduction mechanism assisted by the presence of defects (traps) in the dielectric. More precisely, electrons then propagate by jumping between local states in the bandgap of the dielectric, which states are assumed to be ionized centers (electron donors). This effect results from the lowering of the ionization energy of these centers with application of an electric field (potential difference between the lines). This conduction mechanism produces what is called a "Poole-Frenkel" current, named after the two people who made the general discovery of the existence of such a mechanism in dielectrics.

Thus, it is especially proposed to solve this problem of premature dielectric breakdown using at least one non-porous dielectric barrier inserted between a porous portion of at least one dielectric region and at least one of two electrically conductive elements, for example a metal line or track or a via, of an interconnect portion of an integrated circuit, in order to protect this integrated circuit from breakdown, of said at least one dielectric region, caused by electrical conduction assisted by the presence of defects in said at least one dielectric region.

Such a solution is furthermore broadly compatible with CMOS technology processes in so far as it requires the addition of only a few steps and does not require modification or addition of masks or modification of the layout of the integrated circuit.

Thus, instead of addressing the cause of this problem, i.e. the presence of moisture and/or ionic contamination in the dielectric region, and attempting to suppress or even decrease these causes, the inventors have taken it as read that this conduction pathway will eventually form in the dielectric, and propose instead a solution that blocks this pathway as much as possible, i.e. prevents, as much as possible, a Poole-Frenkel leakage current from flowing between the two electrically conductive elements separated by this dielectric region, this solution employing at least one non-porous dielectric barrier.

In other words, according to one aspect, a process is provided for protecting an integrated circuit from electrical conduction assisted by the presence of defects located in a dielectric region separating two electrically conductive elements of the interconnect portion of the integrated circuit, this process comprising inserting at least one non-porous dielectric barrier between a porous portion of said at least one dielectric region and at least one of the two electrically conductive elements.

Although it is possible in theory to insert this dielectric barrier anywhere in the porous portion of this dielectric region, it is technologically simpler, when the dielectric region includes a porous central portion, to insert said at least one non-porous barrier between this porous central portion and one of the two electrically conductive elements.

It is also preferable, and easier from a technological point of view, to insert two non-porous dielectric barriers respectively between said porous central portion and said two electrically conductive elements.

According to one method of implementation, the porous portion of the dielectric region is characterized by a degree of porosity higher than or equal to a first threshold whereas the non-porous dielectric barrier is characterized by a degree of porosity lower than a second threshold.

In practice, the first threshold may be chosen to be equal to the second threshold, these thresholds for example being set equal to 5%.

In other words, the porous portion of the dielectric region then contains a volume of pores (empty spaces) larger than or equal to 5% of the total volume of the porous portion whereas the non-porous dielectric barrier has a volume of pores lower than 5% of the total volume of this barrier.

It is also advantageous for said porous portion of the dielectric region to include a low-dielectric-constant material.

A low-dielectric-constant material is, for example, considered to be a material the dielectric constant of which is lower than or equal to 3.5.

Many materials may be used for the porous portion of the dielectric region, for example porous silicon oxycarbide (porous SiOC) or, preferably, porous hydrogenated silicon oxycarbide (porous SiOCH).

Said at least one non-porous dielectric barrier preferably has a thickness comprised between a lower thickness and an upper thickness.

The lower thickness is the acceptable thickness limit above which a good barrier effect is obtained with respect to leakage current in the dielectric, whereas the upper thickness is chosen so as not to too greatly increase the dielectric constant of the dielectric region including the preferably low-dielectric-constant porous portion and the non-porous dielectric barrier.

By way of indication, an acceptable thickness for the non-porous dielectric barrier is a thickness comprised between 10 nm and 30 nm.

Many materials may be used for said at least one non-porous dielectric barrier. It is for example possible to use ternary nitrides or even tetra-ethyl-oxy-silane or tetra-ethoxy-silane (TEOS oxide).

This being so, silicon carbonitride (SiCN) in either its amorphous or crystalline state is a preferred material in particular because of its good adhesion to the vertical sidewalls of the porous central portion of the dielectric region.

As indicated above, the two electrically conductive elements may include metal lines of a given metallization level of said interconnect portion or even vias.

This being so, because of the length of the metal tracks, it is statistically more probable that a conduction pathway assisted by defects will be created in an interline dielectric region.

According to another aspect, an integrated circuit is provided, this integrated circuit comprising an interconnect portion including at least one metallization level possessing electrically conductive elements mutually separated by dielectric regions.

According to one general feature of this other aspect, the integrated circuit comprises at least one non-porous dielectric barrier located between a porous portion of at least one dielectric region and at least one of the two electrically conductive elements separated by said at least one dielectric region.

According to one embodiment, said at least one dielectric region includes a porous central portion and said at least one non-porous barrier is located between said porous central portion and one of the electrically conductive elements.

As a variant, the integrated circuit may include two non-porous dielectric barriers respectively located between said porous central portion and said two electrically conductive elements.

BRIEF DESCRIPTION OF THE DRAWINGS

Other advantages and features of the invention will become apparent on examining the detailed description of completely non-limiting methods of implementation and embodiments, and the appended drawings in which.

DETAILED DESCRIPTION

Figure 1:
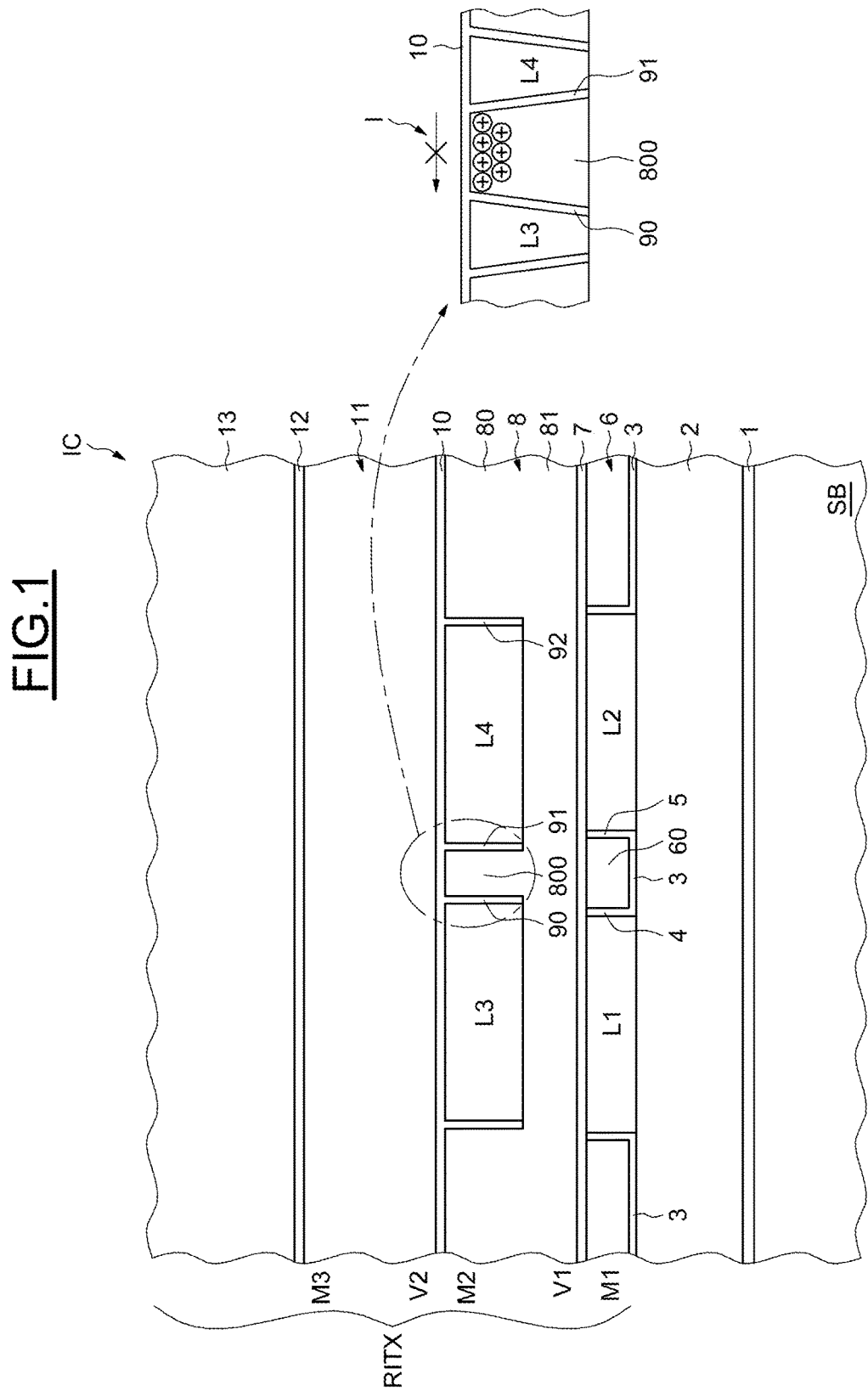
FIGS. 1 to 8 schematically illustrate various methods of implementation and embodiments.

In FIG. 1, the reference IC designates an integrated circuit including a semiconductor substrate SB in and on which various components such as transistors (not shown here for the sake of simplicity) have been produced.

These components and the surface of the substrate SB are conventionally covered with a passivation layer 1, for example a layer of silicon dioxide.

The various components are separated from the interconnect (BEOL) portion of the integrated circuit, this portion here being referenced by the reference RITX, by a first dielectric region 2 commonly referred to, by those skilled in the art, as the pre-metal dielectric (PMD) region.

The interconnect portion RITX includes a plurality of metallization levels and a plurality of via levels. In this example, three metallization levels M1, M2 and M3 have been shown associated with two via levels V1 and V2.

In this exemplary embodiment, two metal tracks or lines L1 and L2 have been shown in the metallization level M1 and two metal tracks L3 and L4 in the second metallization level M2.

In this example, the metal tracks of the level M3 and the vias located in the via levels V1 and V2 are located elsewhere in the integrated circuit and are therefore not shown in this figure.

The various metal tracks, which are for example made of copper, and vias, are embedded in a dielectric material generally referred to, by those skilled in the art, as the intermetal dielectric (IMD).

These dielectric zones IMD are here referenced by the references 6, 8 and 11.

The dielectric material used in these IMD zones 6, 8 and 11 is a porous low-dielectric-constant material (low-k material). By way of example, the material used is hydrogenated silicon oxycarbide (SiOCH) having a porosity of between 20% and 30% and a dielectric constant k equal to 3.

Each IMD zone 6, 8 and 11 is encapsulated between two protective layers 3, 7, 10 and 12 that lie parallel to the substrate and are intended to protect the metal of the metal tracks from oxidization.

It is for example possible to use silicon carbonitride (SiCN), which allows metal tracks made of copper to be protected from oxidation and also prevents diffusion of the copper into the IMD dielectric material.

In FIG. 1, it may be seen that the interline dielectric region separating the two metal lines L1 and L2 includes a porous central portion 60, here formed from SiOCH, flanked by two dielectric barriers 4 and 5 respectively located between the porous central portion 60 and the two metal lines L1 and L2.

Likewise, the interline dielectric region separating the two lines L3 and L4 includes a porous central portion 800, formed from SiOCH, flanked by two dielectric barriers 90 and 91 respectively located between the porous central portion 800 and the two metal lines L3 and L4.

These dielectric barriers 4, 5, 90, 91 are formed from a non-porous dielectric material, i.e. one having a porosity lower than 5%.

In practice, the dielectric barriers are advantageously made of non-porous SiCN, which has a porosity comprised between 2% and 3%.

Moreover, as may be seen in FIG. 1, each metal line, for example the metal line L4, is itself flanked by two non-porous dielectric barriers, namely the barrier 91 and the barrier 92.

This results from one method of implementation of the fabrication process, of which more will be said below.

Furthermore, the lower portion of each metal line does not make contact with a non-porous dielectric barrier, so as to allow optional electrical contact with a subjacent via. Here again, this absence of dielectric barrier from the lower portion of the metal lines results from a method of implementation of the fabrication process.

The interline dielectric region separating the metal lines L3 and L4 is represented in more detail in the right-hand portion of FIG. 1.

It will be noted that in this right-hand portion, the dielectric region has a trapezoidal shape which is a more accurate representation of the actual shape as it results from an etching process.

Due to the presence of moisture and/or ionic contamination, and also because of the trapezoidal shape of the dielectric region, the density of traps is higher at the interface and the heightened presence of ions at this interface contributes to the creation of a leakage current I (defect-assisted current). This being so, the presence of the non-porous diffusion barriers 90 and 91 allows the conduction pathway between the two metal lines to be interrupted and therefore this leakage current I to be very greatly decreased or even suppressed.

Thus, the integrated circuit is protected from premature breakdown of the interline dielectric region.

Figure 2:
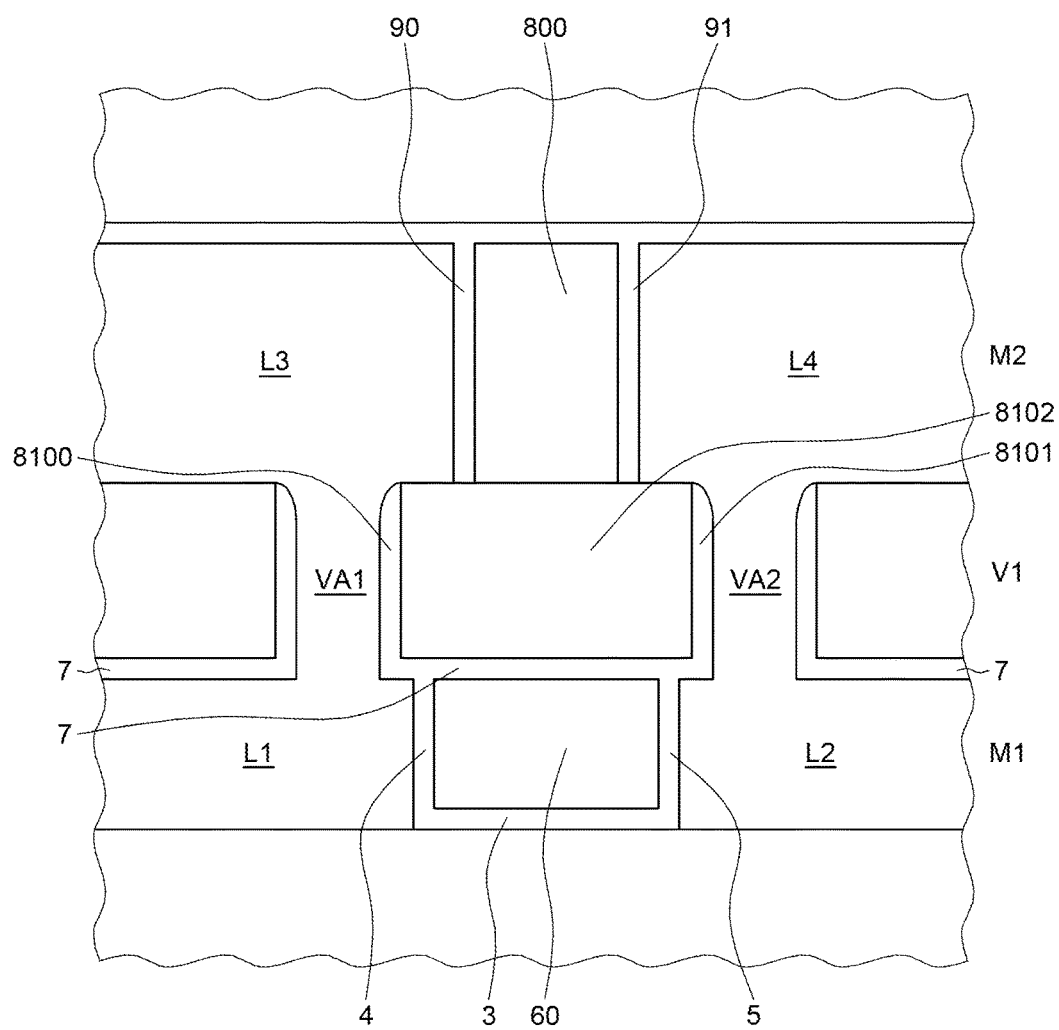

FIG. 2 shows one embodiment of the integrated circuit, including vias VA1 and VA2 located in the via level V1 and electrically connecting the lines L1-L3 and L2-L4, respectively.

Although statistically there is more chance of obtaining a premature dielectric breakdown between two metal lines than between two vias, it is also advantageous, as illustrated in FIG. 2, to also provide non-porous protective barriers in inter-via dielectric regions.

More precisely, in the described example, the dielectric region separating the two vias VA1 and VA2 includes a porous SiOCH central portion 8102 flanked by two non-porous SiCN protective barriers referenced 8100 and 8101, respectively.

Reference is now more particularly made to FIGS. 3 to 8 to describe one method of implementation of a process for producing such an integrated circuit.

With these figures, production of a metal line located in the IMD dielectric zone referenced 8 will be described, but of course the teachings are applicable to any metallization and via level.

Figure 3:
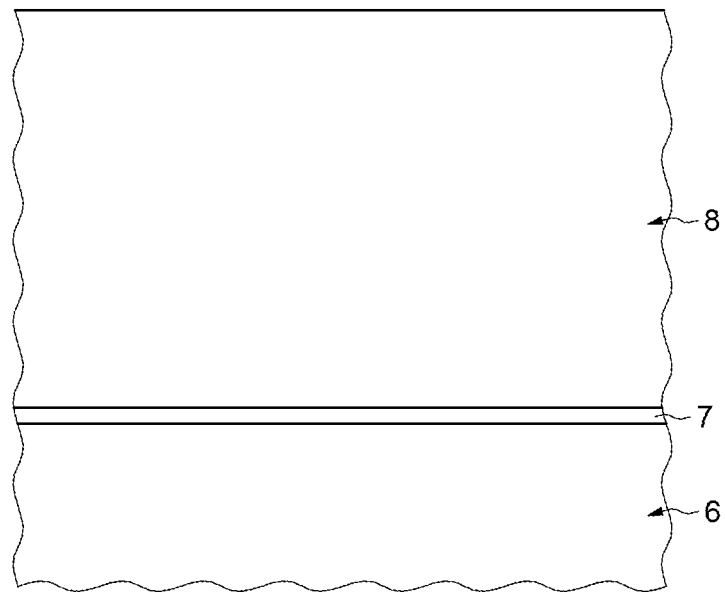

In FIG. 3, a layer 8 of porous dielectric material (SiOCH for example) has been deposited on the protective layer 7 covering the dielectric material 6.

Figure 4:
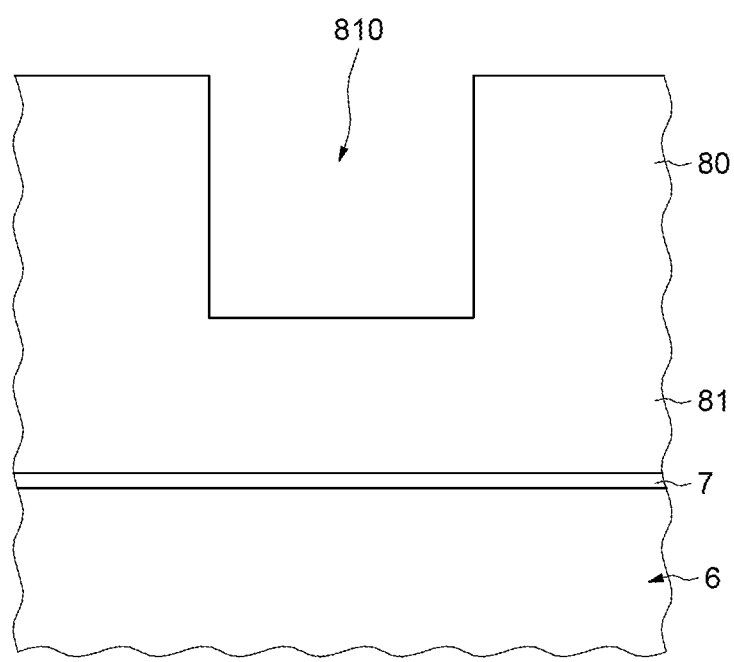

Next, as illustrated in FIG. 4, localized etching of the upper portion 80 of the zone 8 intended to receive the metallization level M2 is carried out. This localized etching allows a trench 810 intended to receive the future metal line to be defined.

In the present case, the etching does not reach the lower portion 81 of the IMD dielectric zone 8 because, in this example, a via subjacent to the metal line is not simultaneously produced.

Figure 5:
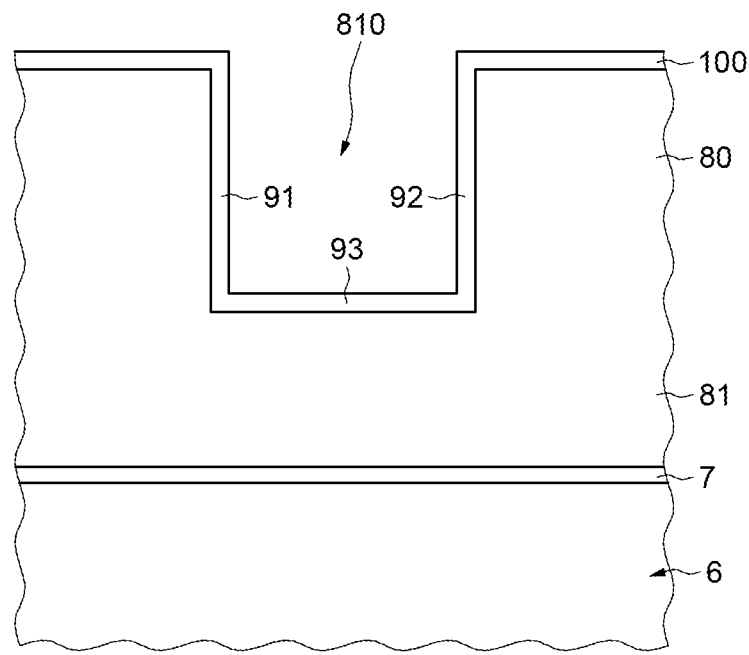

Next, as illustrated in FIG. 5, a non-porous barrier layer, for example of SiCN, is deposited so as to cover the upper portion 80 and line the vertical walls and bottom wall of the trench 810.

As indicated above, this barrier layer may include SiCN.

The SiCN is, as was described above, also deposited immediately after chemical-mechanical polishing of the preceding metallization level. In this regard, when the SiCN is deposited, a prior step of (NH$_3$) plasma cleaning is used, this step having the aim of removing the native oxide layer on the surface of the copper at 350° C.

Furthermore, it has been observed, in this regard, that this plasma cleaning step also improves the adhesion of the SiCN layer to the porous dielectric material 80, especially on the vertical sidewalls of the trench 810.

After the plasma clean, this barrier layer may be deposited using a plasma, in a suitable chamber, by introducing gases allowing SiCN to be deposited (NH$_3$, CH$_3$ and He). The duration of this step sets the thickness of the layer. By way of indication, ten seconds is enough to deposit 30 nm. The deposition is then completed and the last step comprises pumping out residual gases and returning the chamber to atmospheric pressure.

At this stage, as illustrated in FIG. 5, the two non-porous protective barriers 91 and 92 have therefore been formed.

Figure 6:
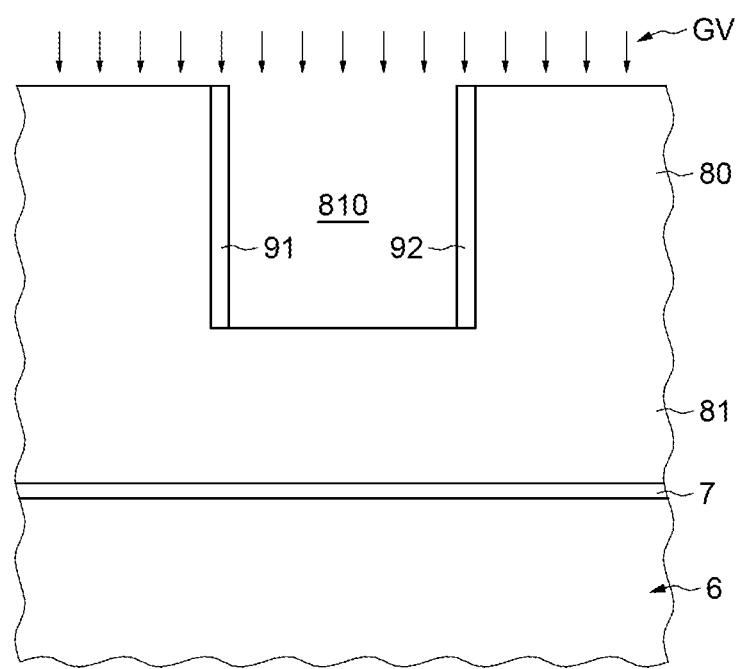

Next, as illustrated in FIG. 6, an anisotropic etch GV, for example a plasma etch, is carried out to remove the portion 93 covering the bottom wall of the trench 810 and the portion 100 covering the upper portion 80 of the porous dielectric.

Removing the portion 93 allows the metal line to make electrical contact with an optional subjacent electrically conductive element, for example a via.

Figure 7:
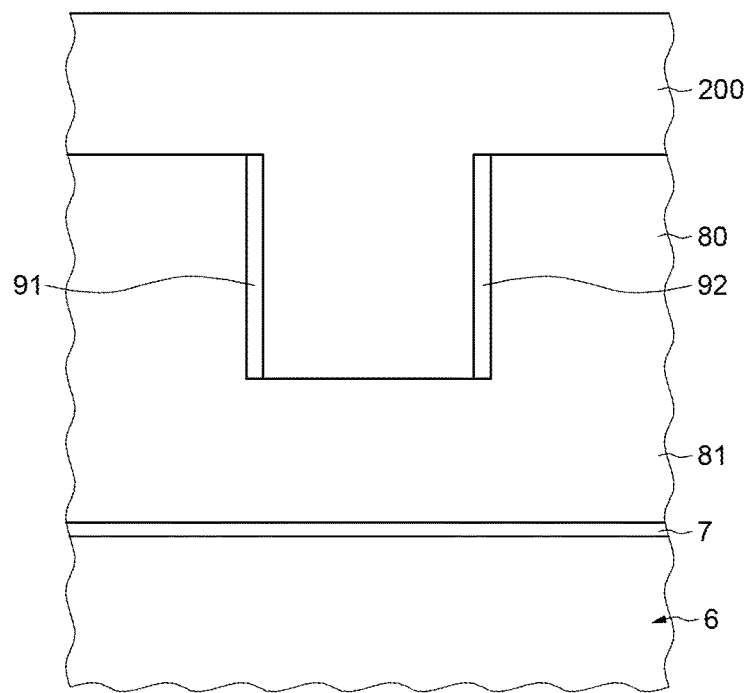

Next, as illustrated in FIG. 7, a multilayer 200 including a (TaN/Ta) barrier layer and a copper layer is deposited on the structure illustrated in FIG. 6. The TaN/Ta barrier layer prevents diffusion of the copper into the dielectric.

Figure 8:
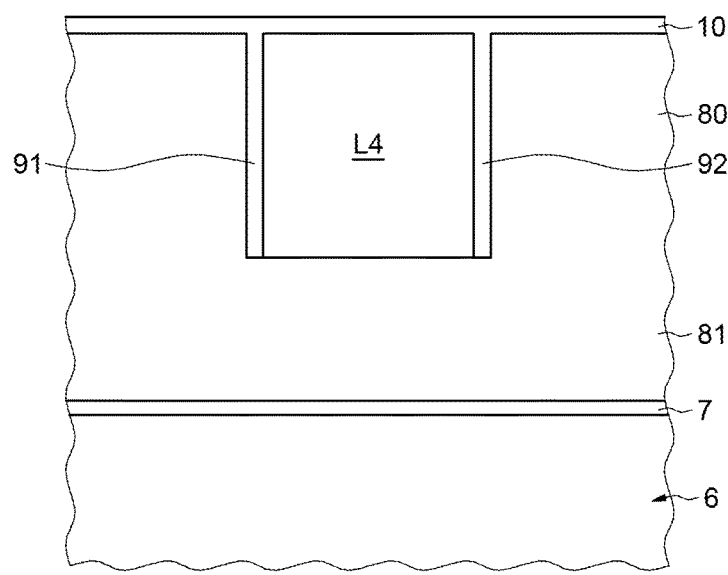

Next, as illustrated in FIG. 8, chemical mechanical polishing is carried out so as to complete the formation of the metal line L4, and then this metal line L4 and the adjacent dielectric are covered with the protective layer 10 made of SiCN.

It should be noted that this production process requires only a few additional steps relative to a conventional CMOS process and that existing masks do not need to be modified or new masks provided.

The invention claimed is:

1. An integrated circuit, comprising:
    a semiconductor substrate having a top surface;
    a porous portion of at least one dielectric region over said semiconductor substrate;
    two electrically conductive lines of an interconnect portion; and
    at least one non-porous dielectric barrier inserted between the porous portion of the at least one dielectric region and each of said two electrically conductive elements of the interconnect portion, wherein the at least one non-porous dielectric barrier does not extend along any lower surface of said two electrically conductive elements which extends parallel to the top surface of the semiconductor substrate;
    said non-porous dielectric barrier configured to protect said integrated circuit from breakdown of said at least one dielectric region caused by electrical conduction assisted by the presence of defects located in said at least one dielectric region.

2. The integrated circuit of claim 1, further comprising a metal via extending from the lower surface of at least one of said two electrically conductive elements, and a further non-porous dielectric barrier inserted between the porous portion of the at least one dielectric region and a side wall of said metal via, wherein said further non-porous dielectric barrier is not in contact with said at least one non-porous dielectric barrier.

3. An integrated circuit, comprising:
    an interconnect portion including at least one metallization level possessing electrically conductive elements mutually separated by a dielectric region and extending parallel to a top surface of a semiconductor substrate;
    at least one non-porous dielectric barrier located between a porous portion of the dielectric region and side walls of the electrically conductive elements separated by said dielectric region, wherein said at least one non-porous dielectric barrier does not extend along a bottom surface of the electrically conductive elements that is parallel to said top surface of the semiconductor substrate.

4. The integrated circuit according to claim 3, wherein said dielectric region includes a porous central portion and said at least one non-porous barrier is located between said porous central portion and each of the electrically conductive elements.

5. The integrated circuit according to claim 3, wherein said porous portion of the dielectric region has a degree of porosity higher than or equal to a first threshold and the non-porous dielectric barrier has a degree of porosity lower than a second threshold.

6. The integrated circuit according to claim 5, wherein the first threshold is equal to the second threshold.

7. The integrated circuit according to claim 5, wherein the first threshold and the second threshold are equal within 5%.

8. The integrated circuit according to claim 3, wherein said porous portion of the dielectric region includes a low-dielectric-constant material.

9. The integrated circuit according to claim 8, wherein the dielectric constant is lower than or equal to 3.5.

10. The integrated circuit according to claim 3, wherein the porous portion of the dielectric region contains porous hydrogenated silicon oxycarbide.

11. The integrated circuit according to claim 3, wherein said at least one non-porous dielectric barrier has a thickness comprised between 10 nm and 30 nm.

12. The integrated circuit according to claim 3, wherein said at least one dielectric barrier comprises silicon carbonitride.

13. The integrated circuit according to claim 3, wherein the electrically conductive elements include metal lines of a given metallization level of said interconnect portion.

14. The integrated circuit according to claim 3, wherein the non-porous dielectric barrier is positioned on a sidewall of a cavity in the porous portion of at least one dielectric region within which the electrically conductive element is located, but is not positioned on a bottom wall of said cavity wherein the bottom wall extends parallel to the top surface of the semiconductor substrate.

* * * * *